United States Patent [19]

Matsumoto et al.

[11] Patent Number: 5,382,544
[45] Date of Patent: Jan. 17, 1995

[54] MANUFACTURING METHOD OF A SEMICONDUCTOR DEVICE UTILIZING THIN METAL FILM

[75] Inventors: Michikazu Matsumoto, Kyoto; Kazuhiko Hashimoto, Moriguchi, both of Japan

[73] Assignee: Matsushita Electric Industrial Co., Ltd., Osaka, Japan

[21] Appl. No.: 66,882

[22] Filed: May 25, 1993

[30] Foreign Application Priority Data

May 25, 1992 [JP] Japan .................................. 4-132177

[51] Int. Cl.⁶ ................. H01L 21/283; H01L 21/3205
[52] U.S. Cl. ..................................... 437/195; 437/228; 437/229; 437/928; 156/659.1; 148/DIG. 17; 148/DIG. 105

[58] Field of Search ............... 437/195, 228, 229, 928; 148/DIG. 105, DIG. 17; 156/644, 659.1; 430/296

[56] References Cited

U.S. PATENT DOCUMENTS 4,612,275 9/1986 Gregor .................................. 430/296
5,139,922 8/1992 Watanabe et al. .................. 430/296

FOREIGN PATENT DOCUMENTS 2-78222 3/1990 Japan .

Primary Examiner—T. N. Quach
Attorney, Agent, or Firm—Ratner & Prestia

[57] ABSTRACT

A semiconductor device is manufactured using the electron beam exposure method. A resist is applied on an interlayer dielectric film through a thin metal film, and a contact hole is formed in the interlayer dielectric film. The thin metal film is utilized as a part of a second metal wiring pattern after removing its surface oxides.

1 Claim, 2 Drawing Sheets ic film, in contact hole forming.
MANUFACTURING METHOD OF A SEMICONDUCTOR DEVICE UTILIZING THIN METAL FILM

BACKGROUND OF THE INVENTION

The present invention relates to a manufacturing method of a semiconductor device employing an electron beam exposure method in a manufacturing process of super-LSI (large scale integration) or the like.

In super-LSI manufacturing processes, the elements are becoming finer and higher in density. Along with the trend of using higher density elements, the wiring pattern length becomes longer, and the wiring pattern width and space are much finer. Lately, in forming ultrafine resist patterns, an exposure method using electron beam (EB exposure) has been developed and put in practical use.

FIG. 2 shows an example of a conventional multilayer metal wiring pattern process. In particular, to make a fine wiring pattern width, a fine wiring pattern space and fine contact holes, the EB exposure method is employed.

In FIG. 2, numeral 1 denotes a silicon substrate forming an active element. Numeral 2 is a first interlayer dielectric film. Usually, after forming elements such as transistors on the silicon substrate 1, the first interlayer dielectric film 2 is deposited. As the first interlayer dielectric film 2, for example, a BPSG (boron doped phospho-silicate glass) film is used. Numeral 3 denotes a first metal wiring, for example, an aluminum film. Numeral 4 is a second interlayer dielectric film, which is to insulate between the metal wiring pattern 3 and its upper metal wiring. Numeral 6 denotes a resist for EB exposure for etching a via hole (hereinafter the contact hole between metal wirings is called the via hole). Numeral 7 is a via hole for connecting between the metal wiring pattern 3 and its upper metal wiring, and it is formed by dry etching using the resist 6 as the mask. Numeral 8 is a second metal wiring to be connected with the first metal wiring pattern 3 through the via hole 7.

Referring to FIG. 2, the conventional process is explained below. FIG. 2(a) represents a state in which the first interlayer dielectric film 2, metal wiring pattern 3 forming patterns, and second interlayer dielectric film 4 are sequentially deposited on the silicon substrate 1. More specifically, the first interlayer dielectric film 2 made of 1 μm thick BPSG film is deposited on the silicon substrate 1 by using an atmospheric Chemical Vapor Deposition (CVD) apparatus. On its upper layer, a 0.8 μm Al film is deposited, patterned, and etched to form the metal wiring pattern 3. Later, by the plasma CVD (plasma-enhanced chemical vapor deposition) method, a silicon oxide film is deposited to form the second interlayer dielectric film 4 having a film thickness of 2 μm. FIG. 2(b) represents a state in which the resist 6 is applied in order to form a via hole. The resist 6 is a resist for EB exposure. For example, a 1.7 μm thick resist 6 is used. FIG. 2(c) represents a state in which the resist 6 is exposed by the EB method and patterned. FIG. 2(d) represents a state in which the second interlayer dielectric film 4 is dry etched by using the resist 6 as the mask. FIG. 2(e) represents a state after removing the resist 6 and cleaning. FIG. 2(f) represents a state in which the metal for a second metal wiring pattern 8 is formed. An Al film is deposited as the second metal wiring pattern 8. FIG. 2(g) represents a patterning state of the second metal wiring 8.

In this manufacturing method, however, since the EB exposure method is used as the exposure method, "charge-up," due to accumulation of incident electrons in the dielectric film, is a serious problem. "Charge-up" refers to an increase in the negative charge of a layer and occurs when the layer is exposed to electrons, for example by way of the via hole during EB exposure. As a result of charge-up, the pattern may be deviated several microseconds during EB exposure. In particular, when the second interlayer dielectric film 4 is thick, or the resist 6 is thick, it is a serious problem. Moreover, if the elements in the base are floating electrically, for example, in the case of elements in a semiconductor-on-insulator (i.e. SOI) structure, there is no escape route for resident electrons, and the effect of charge-up is significant. If charge-up occurs due to EB exposure, the interlayer dielectric film may be broken due to abnormal discharge in a position which is weak electrically, or the alignment signal may not be obtained in exposure, or the alignment may be largely deviated. Furthermore, damage to elements is a problem.

Furthermore, in dry etching after via hole pattern exposure, the selection ratio of the resist 6 and the second interlayer dielectric film 4 is significant. For example, in dry etching of a silicon oxide film, gas such as $CHF_3/O_2/N_2$ is used, and the selection ratio of the resist 6 and oxide film is about 1.5 to 3. As shown in FIG. 2, when the second interlayer dielectric film 4 is deposited to a thickness of 2 μm on a 0.8 μm thick first metal wiring 3, the second interlayer dielectric film 4 has a step of about 0.8 μm due to the presence of the first metal wiring pattern 3. Therefore, assuming the worst condition when a 1.7 μm thick resist 6 is applied, the applied resist 6 becomes thinnest at the position above the first metal wiring pattern 3, with the thickness at this location of 0.9 μm. Of course, in the positions where the first metal wiring pattern 3 is absent, the thickness is 1.7 μm. Hence, supposing the selection ratio to be 2, in the case of etching of the 2 μm thick second interlayer dielectric film 4, if the over-etching rate is 10%, it is desirable to etch by 2.2 μm as converted to the oxide film, and 1.1 μm of the resist 6 is etched. Therefore, the resist 6 on the second interlayer dielectric film 4 in which the first metal wiring pattern is present is completely etched, and the second interlayer dielectric film 4 beneath the resist 6 is also etched to some extent. This problem occurs when the resist film thickness, dry etching condition, step, or other conditions change. In particular, when etched in the above condition, the second interlayer dielectric film 4 is also etched.

SUMMARY OF THE INVENTION

The present invention eliminates charge-up caused by electron beam exposure in a super-LSI manufacturing process, and solves the problem of loss of resist, due to an adverse selection ratio of resist and interlayer dielectric film, in contact hole forming.

The present invention presents a method of manufacturing a semiconductor device comprising the steps of:

forming a first interlayer dielectric film, a first metal wiring, and a second interlayer dielectric film sequentially on a substrate forming elements, and further forming a metal film in a thickness of 100 nm or less on the second interlayer dielectric film, applying a photoresist on the metal film and formed pattern by the electron beam exposure method, or other charged particle beam exposure methods, etching the metal film by using the patterned photoresist as a mask, then etching the second interlayer dielectric film to form a contact hole, removing the photoresist, and removing the metal oxide from the metal film surface by etching, forming a second metal film for forming a wiring pattern on the metal film of which the surface oxide has been removed, patterning a photoresist on the second metal film for wiring, and forming a second metal wiring pattern by etching the metal film of which the surface oxide has been removed and the second metal film for wiring in a specified shape by using the patterned photoresist as a mask.

In this way, a contact hole of high precision is formed, and the metal film having a thickness of 100 μm or less can be used as the second metal wiring, together with the metal film formed later, only by removing the oxide film from the surface.

DETAILED DESCRIPTION OF THE INVENTION

Referring now to FIGS. 1(a)–1(i), a manufacturing method of a semiconductor device according to an exemplary embodiment of the invention is described below. In FIGS. 1(a)–1(i), numeral 1 is a silicon substrate. Numeral 2 is a first interlayer dielectric film. Numeral 3 is a first metal wirings pattern. Numeral 4 is a second interlayer dielectric film. Numeral 5 is a thin metal film necessary for preventing charge-up in EB exposure. Numeral 6 is a resist for patterning a via hole. Numeral 7 is a via hole, and 8 is a second metal wirings pattern.

Figure 1A:
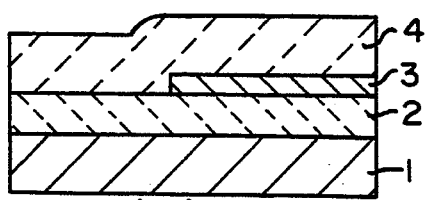
FIGS. 1(a)–1(i) are a series of sectional diagram showing a manufacturing method of a semiconductor device in an exemplary embodiment of the invention.
Figure 1F:
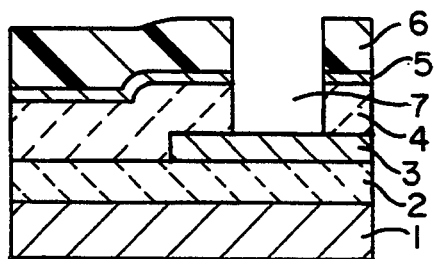
Figure 1B:
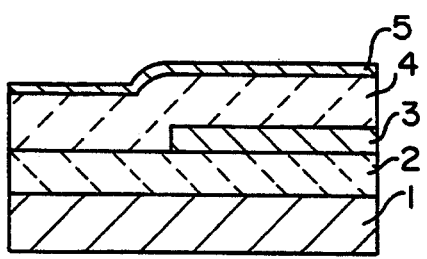
Figure 1G:
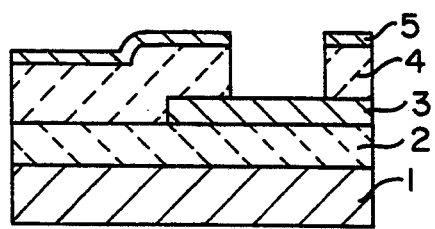
Figure 1C:
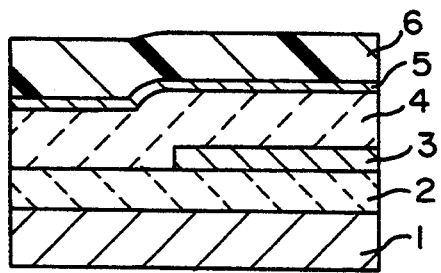
Figure 1H:
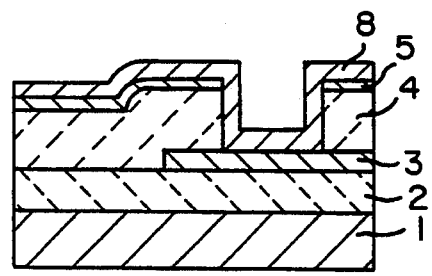
Figure 1D:
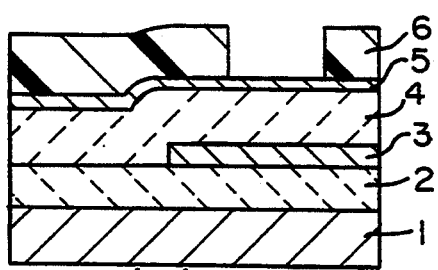
Figure 1I:
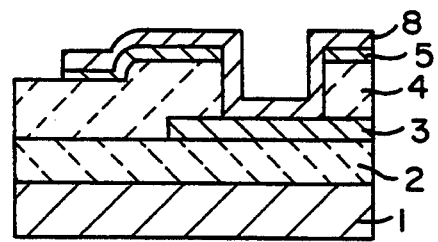
Figure 1E:
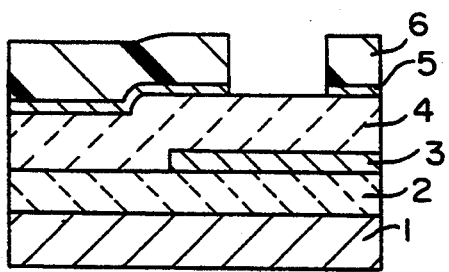
Figure 2A:
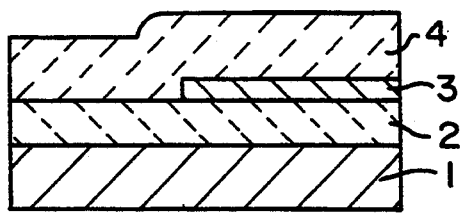
FIGS. 2(a)–2(g) are a series of sectional diagram showing a conventional manufacturing method of a semiconductor device.
Figure 2E:
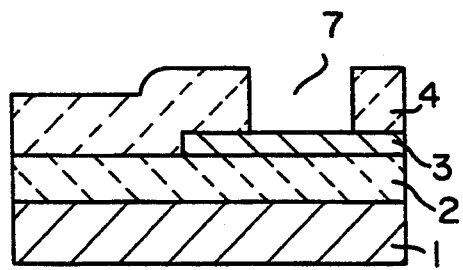
Figure 2B:
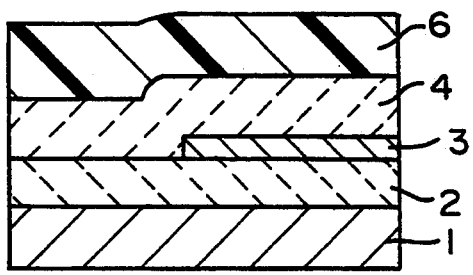
Figure 2F:
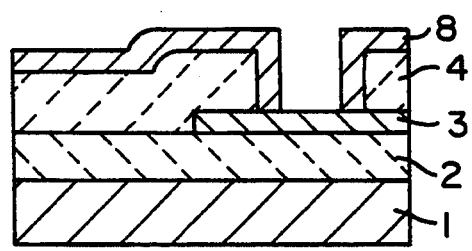
Figure 2C:
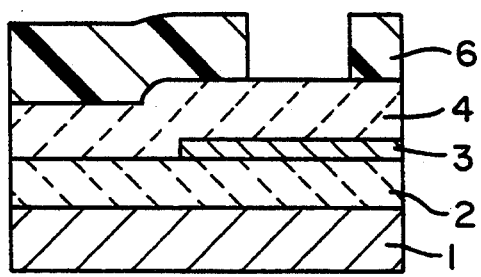
Figure 2G:
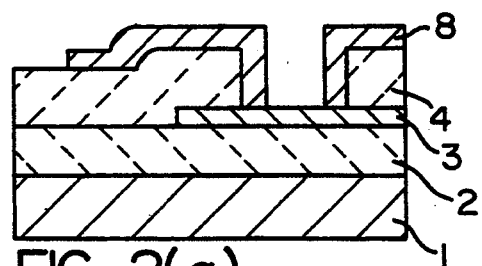
Figure 2D:
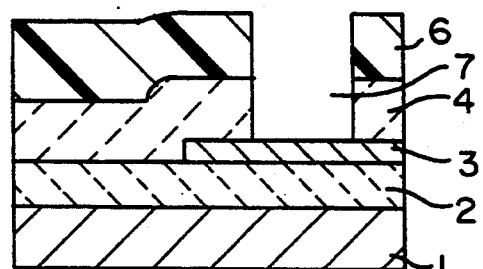

The embodiment is described below in the sequence of process steps. FIG. 1(a) is a state in which the first interlayer dielectric film 2 is formed on the silicon substrate 1, and the first metal wiring pattern 3 and second interlayer dielectric film 4 are deposited on the upper layer of silicon substrate 1. As the first interlayer dielectric film 2, a 1.0 μm thick BPSG film was used. The metal wiring pattern 3 was an aluminum (Al) film, having a film thickness of 1.0 μm. The second interlayer dielectric film 4 was an SiO₂ film deposited by the plasma CVD method, and the film thickness was 2.0 μm. FIG. 1(b) is a state in which a thin metal film 5 was deposited on the second interlayer dielectric film 4 in order to prevent charge-up in EB exposure. The metal film 5 was a 50 nm thick titanium (Ti) layer. FIG. 1(c) is a state of applying the resist 6 for EB exposure on its upper layer. The resist thickness is 1.7 μm. FIG. 1(d) is a patterned state of the resist 6 as being exposed by EB method. The exposure dose is 30 μC/cm². FIG. 1(e) shows a wet etching state of the metal film 5 on the second interlayer dielectric film 4 by using the resist 6 as a mask. The metal film 5 made of Ti can be wet etched by diluted HF (i.e. hydrofluoric acid). Herein, a solution of an HF:H₂O ratio equal to 1:10 was used. At this step, if etching for a finer pattern is desired, dry etching may be employed instead of wet etching. FIG. 1(f) is a state of dry etching of the second interlayer dielectric film 4 successively to the step shown in FIG. 1(e). FIG. 1(g) is a state of removing the resist and cleaning. FIG. 1(h) is a state of forming the second metal wiring pattern 8 on the thin metal film 5 (i.e. the Ti layer). As the second metal wiring 8, a 1.0 μm thick Al film was used. Before stacking of the second metal wiring pattern 8, reverse spattering by argon (Ar) was conducted to remove the metal oxide on the thin metal film 5 (Ti), and then the metal film was deposited. FIG. 1(i) shows a patterned state of the second metal wiring pattern 8.

In the exemplary embodiment, the film thickness was defined as mentioned above. However, as the second interlayer dielectric film 4 becomes thicker to 2 μm and 3 μm, or as the resist for EB exposure becomes thicker, the charge-up is accelerated in the conventional method, and hence the effect of the invention is increased. Besides, in the state in which the elements existing in the base are electrically floating, for example, in the case of an SOI structure, the effect of the invention is outstanding. Moreover, owing to the presence of the thin metal film 5, the selection ratio of the metal film 5 and the second interlayer dielectric film 4 is very large, and if the resist 6 is lost, the metal film 5 will not be etched, and this thin metal film 5 can be used as an etching mask. By forming the second metal wiring pattern 8 on the thin metal film 5 and patterning, the thin metal film 5 can be used as a part of the second wiring pattern. It has been confirmed that it is effective for the precision of patterning if the thickness of the thin metal film 5 is practically 100 nm or less.

In the embodiment discussed above, the metal film 5 is made of Ti, but other metals such as Al, AlSiCu, and W, or conductors such as silicide film may be used. Likewise, as the first metal wiring pattern 3 and second metal wiring pattern 8, any desired material may be freely selected from Ti, Al, AlSiCu, W, silicide films, etc.

In this way, when etching the second interlayer dielectric film 4, by forming a thin metal film 5 on the second interlayer dielectric film 4 before applying the resist, charge-up at the time of EB exposure of the resist 6 can be completely prevented. Therefore, breakdown of the dielectric film or pattern deviation due to abnormal discharge caused by charge-up can be avoided. It is, moreover, easier to obtain an alignment signal in EB exposure. In via hole etching, since the thin metal film 5 is present, the selection ratio of the metal film 5 and second interlayer dielectric film 4 is very large, and if the resist 6 is lost, the metal film 5 is not etched. The thin metal film 5 can be used as an etching mask, and without removing the thin metal film 5 on the second interlayer dielectric film 4, the second metal wiring pattern can be formed on its upper layer, and by patterning at the same time, it can be used as the second metal wiring pattern. It is, however, necessary to remove the metal oxide formed on the surface of the metal film 5 before forming the second metal wiring pattern 8.

What is claimed:

1. A method of manufacturing a semiconductor device using electron beam exposure, said method comprising the steps of:

forming a first interlayer dielectric film, a first metal wiring pattern and a second interlayer dielectric film sequentially on a substrate, and further forming a first metal film in a thickness not greater than 100 nm on the second interlayer dielectric film, applying a photoresist on the first metal film and forming a patterned photoresist by electron beam exposure, etching the first metal film by using the patterned photoresist as a mask, then etching the second interlayer dielectric film to form a contact hole, removing the patterned photoresist, and removing a previously formed metal oxide layer from the first metal film surface by etching, forming a second metal film on the first metal film, patterning a second patterned photoresist on the second metal film, and forming a metal wiring pattern by etching the first metal film and the second metal film by using the second patterned photoresist as a further mask.

* * * * *